(12) United States Patent
Lee et al.

(10) Patent No.: US 11,199,779 B2
(45) Date of Patent: Dec. 14, 2021

(54) DEVELOPER COMPOSITION, FOR EUV LIGHT SOURCE, FOR FORMING PHOTOSENSITIVE PHOTORESIST MICROPATTERN

(71) Applicant: YOUNG CHANG CHEMICAL CO., LTD, Gyeongsangbuk-do (KR)

(72) Inventors: Su Jin Lee, Daegu (KR); Gi Hong Kim, Daegu (KR); Seung Hun Lee, Daegu (KR)

(73) Assignee: YOUNG CHANG CHEMICAL CO., LTD, Gyeongsangbukdo (KR)

(*) Notice: Subject to any disclaimer, the term of this patent is extended or adjusted under 35 U.S.C. 154(b) by 0 days.

(21) Appl. No.: 16/961,407

(22) PCT Filed: Jan. 9, 2019

(86) PCT No.: PCT/KR2019/000307
§ 371 (c)(1),
(2) Date: Jul. 10, 2020

(87) PCT Pub. No.: WO2019/146935
PCT Pub. Date: Aug. 1, 2019

(65) Prior Publication Data
US 2020/0363724 A1 Nov. 19, 2020

(30) Foreign Application Priority Data
Jan. 23, 2018 (KR) .................. 10-2018-0008273

(51) Int. Cl.
*G03F 7/32* (2006.01)
*G03F 7/20* (2006.01)

(52) U.S. Cl.
CPC ............ *G03F 7/322* (2013.01); *G03F 7/2004* (2013.01)

(58) Field of Classification Search
CPC ................ G03F 7/322; G03F 7/70033; G03F 7/702004; G03F 7/2004
USPC .................................. 430/325, 331
See application file for complete search history.

(56) References Cited

U.S. PATENT DOCUMENTS

2007/0003883 A1* 1/2007 Sato ................. G03F 7/322
430/434
2010/0227274 A1* 9/2010 Hatakeyama ......... G03F 7/0397
430/285.1

FOREIGN PATENT DOCUMENTS

| JP | 6175547 B2 | 8/2017 |
| KR | 10-1398846 B1 | 6/2014 |
| KR | 10-2016-0027056 A | 3/2016 |
| KR | 10-1705674 B1 | 2/2017 |
| KR | 10-1759571 B1 | 7/2017 |

* cited by examiner

*Primary Examiner* — Christopher G Young
(74) *Attorney, Agent, or Firm* — Jae Youn Kim; Novick, Kim & Lee, PLLC

(57) ABSTRACT

A photoresist developer composition for an EUV (extreme ultraviolet) light source in a semiconductor-manufacturing process is proposed. Further, the photoresist developer composition for an EUV light source for forming a micropattern and a lithography process of forming a pattern on a semiconductor substrate using an EUV light source using the composition are proposed. The composition includes an aqueous solution containing 2 to 10 wt % of tetraethylammonium hydroxide (TEAH). When a photoresist is developed, an Eop is reduced, which shortens a process time, prevents a pattern from collapsing, and enables a pattern to have a uniform profile.

2 Claims, No Drawings

DEVELOPER COMPOSITION, FOR EUV LIGHT SOURCE, FOR FORMING PHOTOSENSITIVE PHOTORESIST MICROPATTERN

TECHNICAL FIELD

The present invention relates to a developer composition for an EUV (extreme ultraviolet) light source in a semiconductor-manufacturing process. More particularly, the present invention relates to a photoresist developer composition for forming a micropattern, which reduces an Eop (energy of optimum) during developing so that a profile of a pattern is prevented from collapsing, thus forming a more uniform pattern, and to a lithography process using the composition.

BACKGROUND ART

Recently, micropatterns have been required to be realized in accordance with the size reduction and integration of semiconductor devices. A method of forming such a micropattern requires the size of photoresist patterns to be reduced, which is accomplished through the development of exposure apparatuses and the introduction of additional processes or the improvement of processes.

In a process of manufacturing a semiconductor, to date, a pattern has been formed on a semiconductor substrate using an i-line light source having a wavelength of 365 nm. However, a light source in a smaller wavelength band is needed in order to form a finer pattern.

Practical development of lithography using an ArF light source (198 nm) and an EUV (extreme ultraviolet, 13.5 nm) light source commenced with lithography using a KrF light source (248 nm), and a double-exposure technology of ArF lithography (double-patterning lithography) has been also developed. These technologies are now commercially available or are being commercialized, and finer wavelengths may be realized using the same.

The EUV lithography has problems in that a pattern having a desired size is not readily formed or a pattern collapses because carbon atoms are absorbed in a small amount during exposure when a micropattern is formed. When carbon atoms are not absorbed in a sufficient amount in a resist film, a straight pattern is not formed when realizing the micropattern, and sensitivity to EUV is reduced, which makes it impossible to obtain sufficient throughput, leading to a decrease in productivity.

In order to solve this, there is a need to develop a technology for increasing the developing speed of photoresists so that the dose required for developing is reduced and a more uniform pattern is formed.

DISCLOSURE

Technical Problem

The present invention relates to a developer composition for an EUV (extreme ultraviolet) light source in a semiconductor-manufacturing process and a lithography process using the composition. More particularly, an object of the present invention is to provide a developer composition for reducing an Eop during developing so that a profile of a pattern is prevented from collapsing, thus forming a more uniform pattern, and a lithography process using the composition.

Technical Solution

Accordingly, a composition of the present invention includes an aqueous solution containing 2 to 10 wt % of tetraethylammonium hydroxide (TEAH).

Advantageous Effects

A developer composition for an EUV light source for forming a micropattern according to the present invention has a very significant effect of greatly reducing an Eop during developing so that a profile of a pattern is prevented from collapsing, thus forming a more uniform pattern than when using a tetramethylammonium hydroxide (TMAH) or tetrabutylammonium hydroxide (TBAH) aqueous solution used as a conventional developer.

BEST MODE

Hereinafter, the present invention will be described in more detail.

Through continuous research, the inventor of the present invention found that in the case of an aqueous solution containing 2.38 wt % of tetramethylammonium hydroxide (TMAH) or tetrabutylammonium hydroxide (TBAH), which is a conventional developer used in a photo process of a conventional lithography, the productivity thereof is low due to a high dose, and that when the content of tetramethylammonium hydroxide or tetrabutylammonium hydroxide is increased in order to reduce the dose, the size of the pattern is non-uniform and the pattern collapses even when the dose is only slightly reduced. Accordingly, it was found that it is impossible to obtain dramatically increased throughput by reducing a dose, which is the goal to be achieved by the present invention, using a conventionally used tetramethylammonium hydroxide or tetrabutylammonium hydroxide developer.

Moreover, the inventor of the present invention, through a long-term study, invented that a tetraethylammonium hydroxide (TEAH) developer reduces the dose, to thus improve throughput without causing problems related to the tetramethylammonium hydroxide developer. A detailed description thereof will be given below.

Preferably, the tetraethylammonium hydroxide, which is the developer composition of the present invention, is included in an amount of 2 to 10 wt %, and preferably 4 to 10 wt % based on the total weight of the aqueous solution. When the amount of the tetraethylammonium hydroxide is less than 2 wt %, the developing speed is slow, so the improvement in throughput is insufficient. When the tetraethylammonium hydroxide is used in an amount of more than 10 wt %, the developing speed is so fast that there is a risk of the pattern collapsing, which is not preferable.

In a conventional photoresist-patterning process, a 300 mm silicon wafer is spin-coated with a photoresist responsive to the EUV at a speed of 1500 rpm using a spin coater, dried on a hot plate at 110° C. for 60 seconds (SB: soft bake), exposed using an exposure machine generating the EUV, and dried on a hot plate at 110° C. for 60 seconds (PEB: post-exposure bake). A developer containing 2.38 wt % of tetramethylammonium hydroxide is sprayed thereon for 8 seconds and the wafer is then left to stand for 50 seconds (puddle), followed by DI rinsing and then rotation of the wafer for 20 seconds with the number of rotation of 2000 rpm, thereby completing the patterning.

In the present invention, a developer for forming a micropattern is sprayed at a speed of 22 mL/s at 100 rpm for 7 seconds and the wafer is then left to stand for 20 seconds (puddle), followed by DI rinsing and then rotation of the wafer for 20 seconds with the number of rotation of 2000 rpm, thereby completing the formation of a photoresist pattern.

The developer composition for the EUV light source for forming the micropattern and the process method to which the composition is applied can be expected to reduce a dose and form a more uniform pattern during developing, so that the processing time is reduced, and thus manufacturing costs are reduced.

Hereinafter, preferred Examples and Comparative Examples of the present invention will be described. However, the following Examples are only preferred examples of the present invention, and the present invention is not limited to the following Examples.

MODE FOR INVENTION

Examples 1 to 5 and Comparative Examples 1 to 14

Example 1

98 g of deionized water (DI) was added to 2 g of tetraethylammonium hydroxide, mechanical agitation was performed for 12 hours, and the resultant mixture was passed through a 0.02 μm filter, thus manufacturing a developer composition.

The following treatment process was performed to confirm an Eop.

A 300 mm silicon wafer was spin-coated with a photoresist responsive to EUV at a speed of 1500 rpm using a spin coater, dried on a hot plate at 110° C. for 60 seconds (SB: soft bake), exposed using an exposure machine generating the EUV, and dried on a hot plate at 110° C. for 60 seconds (PEB: post-exposure bake). Developing was performed using a developer for forming a micropattern for 60 seconds. Subsequently, the developer for forming the micropattern was sprayed thereon at a speed of 22 mL/s at 100 rpm for 7 seconds and the wafer was then left to stand for 20 seconds (puddle), followed by DI rinsing and then rotation of the wafer for 20 seconds with the number of rotation of 2000 rpm, thereby completing the formation of a photoresist pattern.

Example 2

96 g of deionized water (DI) was added to 4 g of tetraethylammonium hydroxide, mechanical agitation was performed for 12 hours, and the resultant mixture was passed through a 0.02 μm filter, thus manufacturing a developer composition.

A subsequent treatment process was performed in the same manner as in Example 1 to confirm an Eop.

Example 3

94 g of deionized water (DI) was added to 6 g of tetraethylammonium hydroxide, mechanical agitation was performed for 12 hours, and the resultant mixture was passed through a 0.02 μm filter, thus manufacturing a developer composition.

A subsequent treatment process was performed in the same manner as in Example 1 to confirm an Eop.

Example 4

92 g of deionized water (DI) was added to 8 g of tetraethylammonium hydroxide, mechanical agitation was performed for 12 hours, and the resultant mixture was passed through a 0.02 μm filter, thus manufacturing a developer composition.

A subsequent treatment process was performed in the same manner as in Example 1 to confirm an Eop.

Example 5

90 g of deionized water (DI) was added to 10 g of tetraethylammonium hydroxide, mechanical agitation was performed for 12 hours, and the resultant mixture was passed through a 0.02 μm filter, thus manufacturing a developer composition.

A subsequent treatment process was performed in the same manner as in Example 1 to confirm an Eop.

Comparative Example 1

In order to realize a conventional developer, 2.38 g of tetramethylammonium hydroxide (TMAH) was added to 97.62 g of deionized water (DI), mechanical agitation was performed for 12 hours, and the resultant mixture was passed through a 0.02 μm filter, thus manufacturing a developer composition.

A subsequent treatment process was performed in the same manner as in Example 1 to confirm an Eop.

Comparative Example 2

4 g of tetramethylammonium hydroxide (TMAH) was added to 96 g of deionized water (DI), mechanical agitation was performed for 12 hours, and the resultant mixture was passed through a 0.02 μm filter, thus manufacturing a developer composition.

A subsequent treatment process was performed in the same manner as in Example 1 to confirm an Eop.

Comparative Example 3

10 g of tetramethylammonium hydroxide (TMAH) was added to 90 g of deionized water (DI), mechanical agitation was performed for 12 hours, and the resultant mixture was passed through a 0.02 μm filter, thus manufacturing a developer composition.

A subsequent treatment process was performed in the same manner as in Example 1 to confirm an Eop.

Comparative Example 4

1 g of tetraethylammonium hydroxide (TEAH) was added to 99 g of deionized water (DI), mechanical agitation was performed for 12 hours, and the resultant mixture was passed through a 0.02 μm filter, thus manufacturing a developer composition.

A subsequent treatment process was performed in the same manner as in Example 1 to confirm an Eop.

Comparative Example 5

11 g of tetraethylammonium hydroxide (TEAH) was added to 89 g of deionized water (DI), mechanical agitation was performed for 12 hours, and the resultant mixture was passed through a 0.02 μm filter, thus manufacturing a developer composition.

A subsequent treatment process was performed in the same manner as in Example 1 to confirm an Eop.

Comparative Example 6

2 g of tetrabutylammonium hydroxide (TBAH) was added to 98 g of deionized water (DI), mechanical agitation was performed for 12 hours, and the resultant mixture was passed through a 0.02 μm filter, thus manufacturing a developer composition.

A subsequent treatment process was performed in the same manner as in Example 1 to confirm an Eop.

Comparative Example 7

4 g of tetrabutylammonium hydroxide (TBAH) was added to 96 g of deionized water (DI), mechanical agitation was performed for 12 hours, and the resultant mixture was passed through a 0.02 μm filter, thus manufacturing a developer composition.

A subsequent treatment process was performed in the same manner as in Example 1 to confirm an Eop.

Comparative Example 8

10 g of tetrabutylammonium hydroxide (TBAH) was added to 90 g of deionized water (DI), mechanical agitation was performed for 12 hours, and the resultant mixture was passed through a 0.02 μm filter, thus manufacturing a developer composition.

A subsequent treatment process was performed in the same manner as in Example 1 to confirm an Eop.

Comparative Example 9

2 g of tetraethylammonium hydroxide (TEAH) was added to 98 g of deionized water (DI), mechanical agitation was performed for 12 hours, and the resultant mixture was passed through a 0.02 μm filter, thus manufacturing a developer composition.

A subsequent treatment process was performed with an i-line light source using a photoresist responsive to i-line in the same manner as in Example 1 to confirm an Eop.

Comparative Example 10

10 g of tetraethylammonium hydroxide (TEAH) was added to 90 g of deionized water (DI), mechanical agitation was performed for 12 hours, and the resultant mixture was passed through a 0.02 μm filter, thus manufacturing a developer composition.

A subsequent treatment process was performed with an i-line light source using a photoresist responsive to i-line in the same manner as in Example 1 to confirm an Eop.

Comparative Example 11

2 g of tetraethylammonium hydroxide (TEAH) was added to 98 g of deionized water (DI), mechanical agitation was performed for 12 hours, and the resultant mixture was passed through a 0.02 μm filter, thus manufacturing a developer composition.

A subsequent treatment process was performed with a KrF light source using a photoresist responsive to KrF in the same manner as in Example 1 to confirm an Eop.

Comparative Example 12

10 g of tetraethylammonium hydroxide (TEAH) was added to 90 g of deionized water (DI), mechanical agitation was performed for 12 hours, and the resultant mixture was passed through a 0.02 μm filter, thus manufacturing a developer composition.

A subsequent treatment process was performed with a KrF light source using a photoresist responsive to KrF in the same manner as in Example 1 to confirm an Eop.

Comparative Example 13

2 g of tetraethylammonium hydroxide (TEAH) was added to 98 g of deionized water (DI), mechanical agitation was performed for 12 hours, and the resultant mixture was passed through a 0.02 μm filter, thus manufacturing a developer composition.

A subsequent treatment process was performed with an ArF light source using a photoresist responsive to ArF in the same manner as in Example 1 to confirm an Eop.

Comparative Example 14

10 g of tetraethylammonium hydroxide (TEAH) was added to 90 g of deionized water (DI), mechanical agitation was performed for 12 hours, and the resultant mixture was passed through a 0.02 μm filter, thus manufacturing a developer composition.

A subsequent treatment process was performed with an ArF light source using a photoresist responsive to ArF in the same manner as in Example 1 to confirm an Eop.

Characteristic Measurement Experiment

Table 2 shows the results obtained by measuring the EOP, the collapse, and the pattern profile forming 20 nm lines and spaces using a CD-SEM (Hitachi S-8820 series) in Examples 1 to 5 and Comparative Examples 1 to 14. When the Eop (mJ/cm$^2$) is improved compared to the case of 2.38 wt % of tetramethylammonium hydroxide (TMAH), when the pattern does not collapse, and when the profile is improved to be very good, the useful result of being able to form a more uniform pattern is ensured.

The profile was based on the result value of CDU (critical dimension uniformity, line width uniformity) confirmed by measuring the pattern uniformity of the entire area after the entire wafer was developed while fixing energy and focuses. The profile is as follows.

In the present invention, only a very good profile with a CDU of less than 1% is selected.

<Profile>
1. Very poor: CDU of 6% or more
2. Poor: CDU of 4% or more and less than 6%
3. Moderate: CDU of 2% or more and less than 4%
4. Slightly good: CDU of 1% or more and less than 2%
5. Very good: CDU of less than 1%

TABLE 1

| | Eop (mJ/cm$^2$) | Presence or absence of collapse | Profile |
|---|---|---|---|
| Example 1 | 23 | Not collapsed | 5 |
| Example 2 | 20 | Not collapsed | 5 |
| Example 3 | 19 | Not collapsed | 5 |
| Example 4 | 17 | Not collapsed | 5 |
| Example 5 | 15 | Not collapsed | 5 |
| Comparative Example 1 | 24 | Not collapsed | 4 |
| Comparative Example 2 | 21 | Not collapsed | 3 |
| Comparative Example 3 | 15 | Collapsed | 1 |
| Comparative Example 4 | 26 | Not collapsed | 5 |
| Comparative Example 5 | 14 | Collapsed | 3 |
| Comparative Example 6 | 27 | Not collapsed | 4 |
| Comparative Example 7 | 22 | Not collapsed | 4 |

TABLE 1-continued

| | Eop (mJ/cm$^2$) | Presence or absence of collapse | Profile |
|---|---|---|---|
| Comparative Example 8 | 17 | Collapsed | 2 |
| Comparative Example 9 | Not developed | — | — |
| Comparative Example 10 | Not developed | — | — |
| Comparative Example 11 | Not developed | — | — |
| Comparative Example 12 | Not developed | — | — |
| Comparative Example 13 | Not developed | — | — |
| Comparative Example 14 | Not developed | — | — |

According to the results of the characteristic measurement experiment of Table 1, the aqueous solutions containing 2 to 10 wt % of tetraethylammonium hydroxide (TEAH) of Examples 1 to 5 exhibited desirable results with very remarkable effects: the Eop (mJ/cm$^2$) is 23 or less, which indicates that a process time is greatly shortened, the collapse of the pattern does not occur, and the CDU (critical dimension uniformity, line width uniformity) is less than 2%, which indicates that the profile is good.

Moreover, the aqueous solutions containing 4 to 10 wt % of tetraethylammonium hydroxide (TEAH) of Examples 2 to 5 exhibit more desirable results: the Eop is 20 (Example 2) to 15 (Example 5), which indicates that a process time is still further shortened, the collapse of the pattern does not occur, and the CDU is less than 2%, which indicates that the profile is good.

In evaluation of deviation of the concentration of tetraethylammonium hydroxide (TEAH) from the above-described concentration range, it was confirmed that the case in which the concentration of the tetraethylammonium hydroxide (TEAH) was less than 2 wt %, that is, the case in which the concentration was 1 wt %, as in Comparative Example 4, could not be implemented in practice because the Eop was large, specifically 26, indicating that the case did not exhibit the effect of shortening the process time.

Further, it was confirmed that the case in which the concentration of tetraethylammonium hydroxide (TEAH) was more than 10 wt %, that is, the case in which the concentration was 11 wt %, as in Comparative Example 5, could not be implemented in practice because collapse of the pattern occurred and because the CDU (critical dimension uniformity, line width uniformity) was less than 4%, indicating that the profile of the pattern was relatively poor.

Meanwhile, in evaluation of the concentration of tetramethylammonium hydroxide (TMAH), it was confirmed that the case in which the concentration of the tetramethylammonium hydroxide (TMAH) was low, that is, Comparative Example 1, in which the concentration was 2.38 wt %, could not be implemented in practice because the Eop was somewhat large, namely 24, indicating that there was an effect of insufficiently shortening the process time and because the CDU (critical dimension uniformity, line width uniformity) was less than 2%, indicating that the profile of the pattern was not very good.

Further, it was confirmed that the case of an intermediate concentration of tetramethylammonium hydroxide (TMAH), that is, Comparative Example 2, in which the concentration was 4 wt %, could not be implemented in practice because the CDU (critical dimension uniformity, line width uniformity) was less than 4% even though the Eop was reduced, indicating that the profile of the pattern was relatively poor.

In addition, it was confirmed that the case in which the concentration of the tetramethylammonium hydroxide (TMAH) was high, that is, Comparative Example 3, in which the concentration was 10 wt %, could not be implemented in practice because collapse of the pattern occurred and because the CDU (critical dimension uniformity, line width uniformity) was less than 4% even though the Eop was reduced as in Comparative Example 3, indicating that the profile of the pattern was relatively poor.

Accordingly, it was confirmed that none of the cases ranging from the low concentration to the high concentration of the tetramethylammonium hydroxide (TMAH) could be implemented in practice.

Meanwhile, in evaluation of the concentration of tetrabutylammonium hydroxide (TBAH), it was confirmed that none of the cases ranging from the low concentration to the high concentration of the tetrabutylammonium hydroxide could be implemented in practice because all cases using tetrabutylammonium hydroxide were observed to exhibit the same tendency as tetramethylammonium hydroxide (TMAH).

Moreover, in evaluation of individual light sources, according to the results of the characteristic measurement experiments of Comparative Examples 9 to 14 performed when the concentration of the tetraethylammonium hydroxide (TEAH) was 2 wt % and 10 wt %, it was confirmed that the cases of i-line, KrF, and ArF light sources could not be implemented in practice because developing of photoresists was not observed in the cases of the i-line, KrF, and ArF light sources even though all conditions were the same as those of the case of the EUV light source throughout the entire concentration range of tetraethylammonium hydroxide, from the low concentration (2 wt %) to the high concentration (10 wt %) thereof.

Therefore, it was confirmed that, in the case of tetraethylammonium hydroxide (TEAH), the photoresist was developed only when the EUV light source was used.

This is assumed to be because there is a difference between the developing speeds of the photoresists corresponding to the individual light sources.

That is, in a conventional developing process performed using the i-line, KrF, or ArF light source instead of the EUV light source, a developer containing 2.38 wt % of tetramethylammonium hydroxide (TMAH) or tetrabutylammonium hydroxide (TBAH) is sprayed instead of the tetraethylammonium hydroxide (TEAH) used in the present invention for 8 to 10 seconds and the wafer is then left to stand for 50 to 60 seconds (puddle), followed by DI rinsing and then rotation of the wafer for 20 seconds with the number of rotation of 2000 rpm, thereby completing patterning. Accordingly, the developing is accomplished only when the wafer is left to stand for 50 to 60 seconds or more.

In contrast, in the present invention, as shown in Examples 1 to 5 and Table 1, the developing is performed using the EUV light source. A developer containing 2 to 10 wt % of tetraethylammonium hydroxide (TEAH) is sprayed for 7 seconds and the wafer is then left to stand for 20 seconds (puddle), followed by DI rinsing and then rotation of the wafer for 20 seconds with the number of rotation of 2000 rpm, thereby completing the patterning.

Therefore, in the present invention, a spraying time is 7 seconds, which is shorter than 8 to 10 seconds in the conventional technology, and a stationary time is 20 seconds, which is significantly shorter than 50 to 60 seconds in the conventional technology. Accordingly, the present invention shows a remarkable effect in that the throughput is shortened, thus greatly reducing the process time.

In order to confirm the effect of shortening the processing time, the percentages (%) of the spraying time and the stationary time of the present invention compared to those of the conventional technology are calculated as follows.

That is, the process time of the present invention/the process time of the conventional technology (%) is (spraying for 7 seconds+stationary state for 20 seconds)/(spraying for 8 to 10 seconds+stationary state for 50 to 60 seconds)×100.

It can be seen that this is solved to be (7+20)/(8+50)× 100(%) to (7+20)/(10+60)×100(%) and is calculated to be 46 to 38%.

Accordingly, it can be seen that there is an effect of reducing the process time by 54 to 62%, which is very remarkable.

The invention claimed is:

1. A photoresist developer composition for an EUV light source, consisting of:
    4 to 10 wt % of tetraethylammonium hydroxide and 90 to 96 wt % of deionized water to develop a photoresist in a lithography process of forming a pattern on a semiconductor substrate using the EUV light source.

2. A lithography process of forming a pattern on a semiconductor substrate using an EUV light source using the photoresist developer composition for the EUV light source of claim 1.

* * * * *